United States Patent
Hsieh et al.

(10) Patent No.: US 11,317,523 B2
(45) Date of Patent: Apr. 26, 2022

(54) BUCKLE ASSEMBLY AND ELECTRONIC DEVICE USING THE SAME

(71) Applicant: PEGATRON CORPORATION, Taipei (TW)

(72) Inventors: Chen-Yun Hsieh, Taipei (TW); Wei-Lung Lin, Taipei (TW); Geng-Siang Hu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/185,346

(22) Filed: Feb. 25, 2021

(65) Prior Publication Data

US 2021/0282278 A1   Sep. 9, 2021

(30) Foreign Application Priority Data

Mar. 6, 2020 (TW) ................................. 109107512

(51) Int. Cl.
*H05K 5/00* (2006.01)
*F16B 35/04* (2006.01)

(52) U.S. Cl.
CPC ......... *H05K 5/0008* (2013.01); *F16B 35/048* (2013.01)

(58) Field of Classification Search
CPC ............................ H05K 5/0008; F16B 35/048
See application file for complete search history.

(56) References Cited

U.S. PATENT DOCUMENTS

| | | | | |
|---|---|---|---|---|
| 4,711,361 A | * | 12/1987 | Mischenko | B65D 11/1873 D13/184 |
| 5,750,924 A | * | 5/1998 | Sonntag | H02B 1/46 174/50 |
| 11,051,593 B2 | * | 7/2021 | Catanese | A44C 5/2057 |
| 11,153,984 B1 | * | 10/2021 | Chen | H05K 5/0008 |
| 2014/0109379 A1 | * | 4/2014 | Farahani | G06F 1/1633 411/103 |
| 2015/0237291 A1 | * | 8/2015 | Ohki | H05K 5/0017 361/679.01 |
| 2020/0080580 A1 | * | 3/2020 | Clavelle | F16B 5/02 |
| 2020/0120819 A1 | * | 4/2020 | Lee | G06F 1/182 |
| 2020/0236799 A1 | * | 7/2020 | Roth | H05K 5/0204 |
| 2021/0282283 A1 | * | 9/2021 | Hu | G06F 1/1658 |
| 2021/0372446 A1 | * | 12/2021 | Ramos | H02G 3/14 |

FOREIGN PATENT DOCUMENTS

| | | |
|---|---|---|
| CN | 104270483 | 1/2015 |
| CN | 205336709 | 6/2016 |

\* cited by examiner

*Primary Examiner* — Hung V Ngo
(74) *Attorney, Agent, or Firm* — J.C. Patents

(57) ABSTRACT

A buckle assembly and an electronic device using the same are provided. The buckle assembly is adapted to be assembled on a housing of the electronic device. The housing has an inner surface and a first hole. The buckle assembly includes an assembly element, a slider, and an abutting member. The assembly element is assembled in the first hole along a first direction; the slider is disposed on the inner surface of the housing and is capable of moving relative to the housing along a second direction to lock or unlock the assembly element, wherein the second direction is perpendicular to the first direction; and the abutting member is disposed on the inner surface of the housing and is used to abut against the slider when the slider locks the assembly element.

15 Claims, 8 Drawing Sheets

BUCKLE ASSEMBLY AND ELECTRONIC DEVICE USING THE SAME

CROSS-REFERENCE TO RELATED APPLICATION

This application claims the priority benefit of Taiwan application serial no. 109107512, filed on Mar. 6, 2020. The entirety of the above-mentioned patent application is hereby incorporated by reference herein and made a part of this specification.

BACKGROUND

Technical Field

The disclosure relates to an assembly and a device, and particularly relates to a buckle assembly and an electronic device using the buckle assembly.

Description of Related Art

Laptop computers are usually set up as standard configuration to meet the CRU (customer replaceable units) requirements, so that the end user who may have only the general mechanical disassembly knowledge can disassemble the lower cover of the system.

The conventional design usually uses the screw on the lower cover together with the metal E-ring and fits the E-ring to the threadless area on the screw to fix the lower cover.

However, using the metal E-ring may face the following three risks:

1. Since the opening of the E-ring interferes with the screw, if the operator deforms the E-ring when assembling the E-ring and the screw, the E-ring may fall off when the screw is unscrewed.

2. If the thickness of the E-ring is the same as or smaller than the thread width of the screw, the E-ring may be caught between the threads and fall off when the screw is unscrewed. Such a problem may be improved by increasing the thickness of the E-ring, but it cannot be completely prevented.

3. The screws of some models may be used for electrical grounding. For this reason, there may be a layer of conductive fiber cloth attached between the screw and the E-ring as a medium. However, when the screw is unscrewed, the conductive cloth may be caught into the gap between the screw and the E-ring, which enlarges the inner diameter of the E-ring and causes the E-ring to fall off.

The above three conditions may cause the E-ring to fall onto the circuit board in the electronic device, result in a short circuit, and burn the circuit board.

SUMMARY

The disclosure provides a buckle assembly which prevents a part from falling off and falling into an electronic device to cause a short circuit of a circuit board.

The disclosure provides an electronic device which has a long service life while meeting the CRU requirements.

A buckle assembly according to the disclosure is adapted to be assembled on a housing. The housing has an inner surface and a first hole. The buckle assembly includes an assembly element, a slider, and an abutting member. The assembly element is assembled in the first hole along a first direction. The slider is disposed on the inner surface of the housing and is capable of moving relative to the housing along a second direction to lock or unlock the assembly element. The second direction is perpendicular to the first direction. The abutting member is disposed on the inner surface of the housing and is used to abut against the slider when the slider locks the assembly element.

An electronic device according to the disclosure includes the above-mentioned housing, and the above-mentioned buckle assembly is applied to the electronic device.

In an embodiment of the disclosure, the assembly element is a screw and the first hole is a screw hole.

In an embodiment of the disclosure, the screw includes a screw head, a threadless area, and a threaded area, and the threadless area is located between the screw head and the threaded area.

In an embodiment of the disclosure, the housing further includes a stop rib disposed on the inner surface and adjacent to the first hole, and when the screw is screwed into the housing and unlocked from the slider, a bottom end of the threaded area comes into contact with the stop rib.

In an embodiment of the disclosure, a surface of the stop rib facing an upper cover of the housing and a surface of the slider facing the upper cover of the housing jointly form a stop surface, and when the screw is unscrewed from the first hole, the stop surface supports and stops the screw from completely falling out of the first hole.

In an embodiment of the disclosure, the slider includes a body portion and a U-shaped portion, and the U-shaped portion is located at an end of the body portion relatively close to the assembly element.

In an embodiment of the disclosure, the housing further includes a first guiding structure, and the slider further includes a second guiding structure, and the first guiding structure and the second guiding structure are fitted to each other for the slider to move linearly relative to the housing.

In an embodiment of the disclosure, one of the first guiding structure and the second guiding structure is a position limiting rib, and the other of the first guiding structure and the second guiding structure is a position limiting groove.

In an embodiment of the disclosure, a hole diameter of the first hole gradually decreases from an outer surface of the housing toward the inner surface.

Based on the above, the buckle assembly and the electronic device using the buckle assembly according to the disclosure are capable of preventing a part from falling off and falling into the electronic device to cause a short circuit and burn the circuit board.

In order to make the above more comprehensible, the following exemplary embodiments will be described in detail with reference to the accompanying drawings.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1:
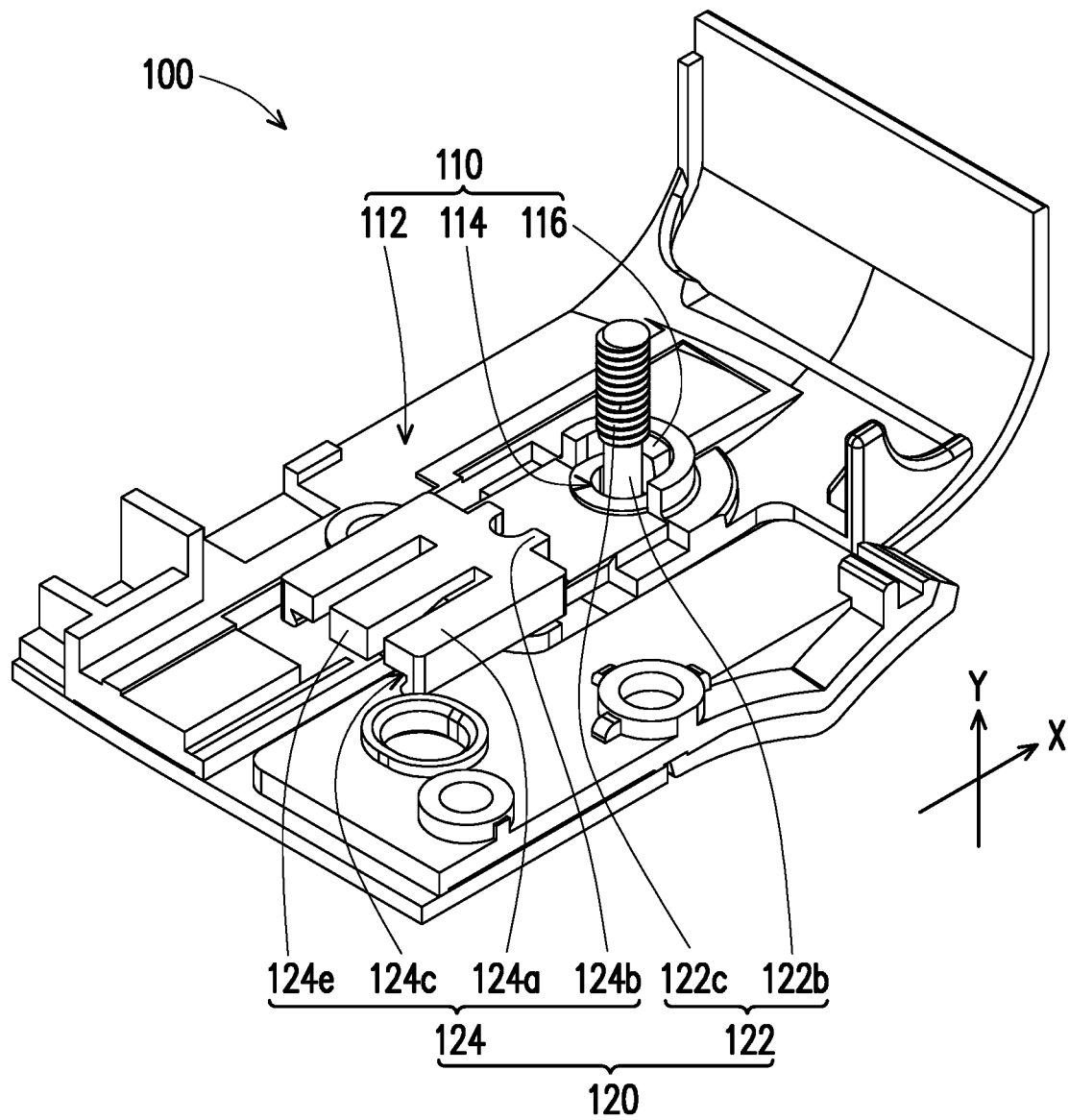
FIG. 1 is a partial schematic view of an electronic device according to an embodiment of the disclosure.
Figure 2:
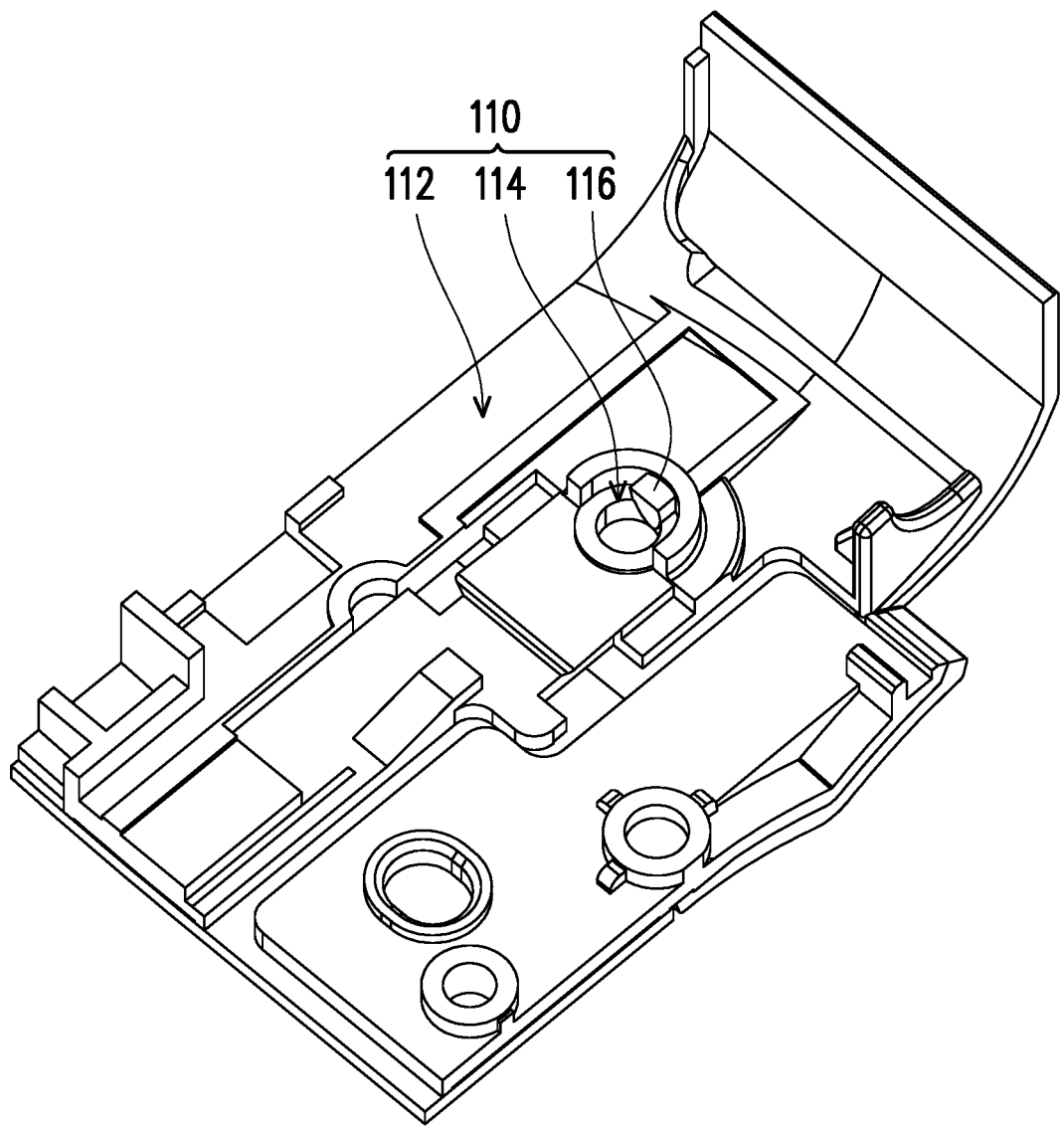
FIG. 2 is a schematic view showing a first hole by omitting an assembly element in FIG. 1.
Figure 3:
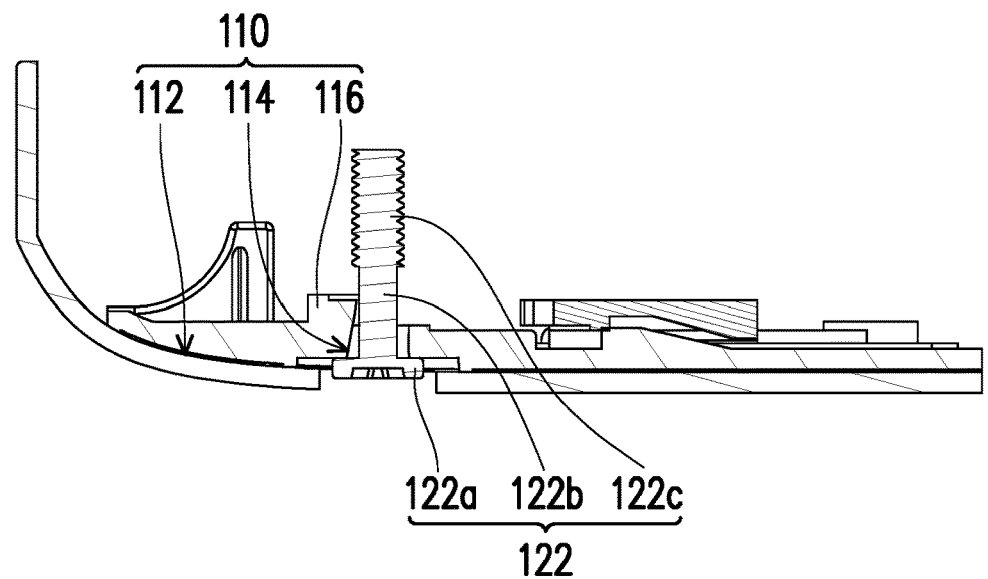
FIG. 3 is a schematic cross-sectional view along the line A-A of FIG. 1.

FIG. 1 is a partial schematic view of an electronic device according to an embodiment of the disclosure, FIG. 2 is a schematic view showing a first hole by omitting an assembly element in FIG. 1, and FIG. 3 is a schematic cross-sectional view along the line A-A of FIG. 1. Referring to FIG. 1, FIG. 2, and FIG. 3, the electronic device 100 of this embodiment is a laptop computer, and the electronic device 100 includes a housing 110 and a buckle assembly 120.

The housing 110 has an inner surface 112 and a first hole 114, wherein the hole diameter of the first hole 114 gradually decreases from an outer surface of the housing 110 toward the inner surface 112. Specifically, the first hole 114 has a side wall, and in the radial direction of the first hole 114, a portion of the side wall located on one side of the first hole 114 is inclined from the outer surface of the housing 110 toward the inner surface 112, so that a partial hole diameter of the first hole 114 gradually decreases from the outer surface toward the inner surface 112.

The buckle assembly 120 assembled on the housing 110 includes an assembly element 122, a slider 124, and an abutting member 126.

The assembly element 122 is assembled in the first hole 114 along a first direction Y, wherein the first direction Y is a direction perpendicular to the inner surface 112 of the housing 110. Specifically, the assembly element 122 is a screw, and the first hole 114 is a screw hole. The assembly element 122 that is a screw includes a screw head 122a, a threadless area 122b, and a threaded area 122c. The threadless area 122b is located between the screw head 122a and the threaded area 122c.

The slider 124 is disposed on the inner surface 112 of the housing 110 and is capable of moving relative to the housing 110 along a second direction X to lock or unlock the assembly element 122, wherein the second direction X is perpendicular to the first direction Y. That is, the second direction X is a horizontal direction. The slider 124 includes a body portion 124a and a U-shaped portion 124b, wherein the U-shaped portion 124b is located at one end of the body portion 124a relatively close to the assembly element 122.

The abutting member 126 is disposed on the inner surface 112 of the housing 110 for abutting against the slider 124 when the slider 124 locks the assembly element 122. The abutting member 126 of this embodiment may be integrally formed with the housing 110, or may be disposed on the inner surface 112 of the housing 110 through post processing.

Figure 4:
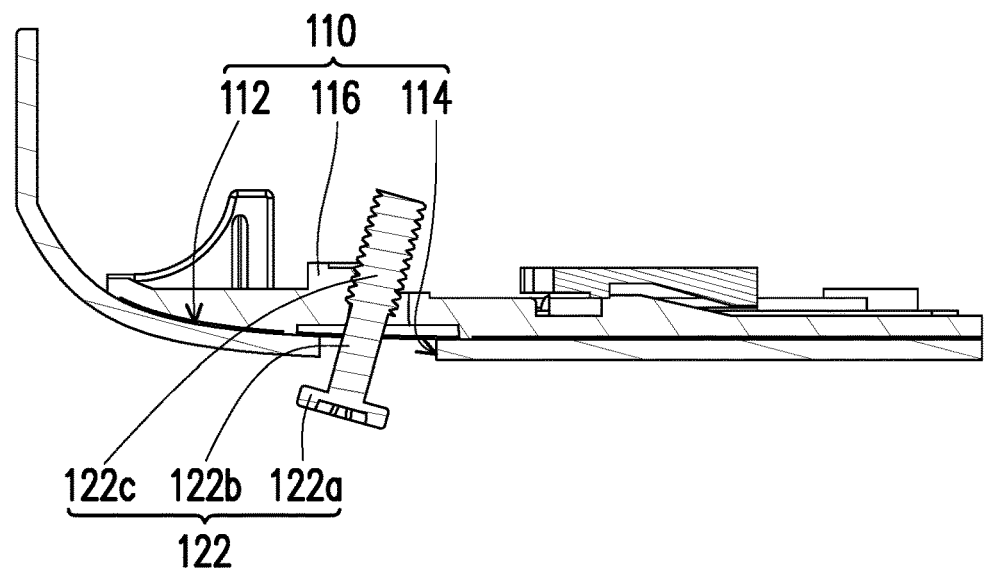
FIG. 4 is a schematic view of the assembly element screwed into the housing.

FIG. 4 is a schematic view of the assembly element 122 screwed into the housing 110. Referring to FIG. 1, FIG. 3, and FIG. 4, when the assembly element 122 is screwed into the housing 110, the assembly element 122 that is a screw is inserted obliquely into the housing 110, wherein the inner diameter of the first hole 114 is larger than the outer diameters of the threaded area 122c and the threadless area 122b. However, the inner diameter of the first hole 114 is smaller than the outer diameter of the screw head 122a, so the screw head 122a of the assembly element 122 that is a screw is kept outside the housing 110.

After the assembly element 122 is screwed into the housing 110, the assembly element 122 rotates from the inclined state to a state where the axial direction of the assembly element 122 is parallel to the first direction Y through the coordination of the outer surface of the housing 110 and the screw head 122a. Next, the slider 124 is moved closer to the assembly element 122 along the second direction X, and the U-shaped portion 124b located at the front end of the body portion 124a of the slider 124 is fitted to the threadless area 122b of the assembly element 122.

It should be noted that the housing 110 further includes a stop rib 116 disposed on the inner surface 112 and adjacent to the first hole 114. When the assembly element 122 is initially screwed into the housing 110, after the assembly element 122 rotates from the inclined state to the state where the axial direction thereof is parallel to the first direction Y, the surface of the stop rib 116 facing the upper cover 110a and the surface of the U-shaped portion 124b facing the upper cover 110a jointly form a stop surface 116a that is capable of preventing the assembly element 122 from falling off. Specifically, when the assembly element 122 is unscrewed from the first hole 114, the stop surface 116a supports and stops the assembly element 122 when the assembly element 122 receives no force and naturally falls down. In other words, the lower end of the threaded area 122c comes into contact with the stop surface 116a, thereby preventing the assembly element 122 from completely falling out of the housing 110 and keeping a portion of the assembly element 122 inside the housing 110. At the same time, the unscrewing of the assembly element 122 also lifts the upper cover 110a of the housing 110.

Figure 5:
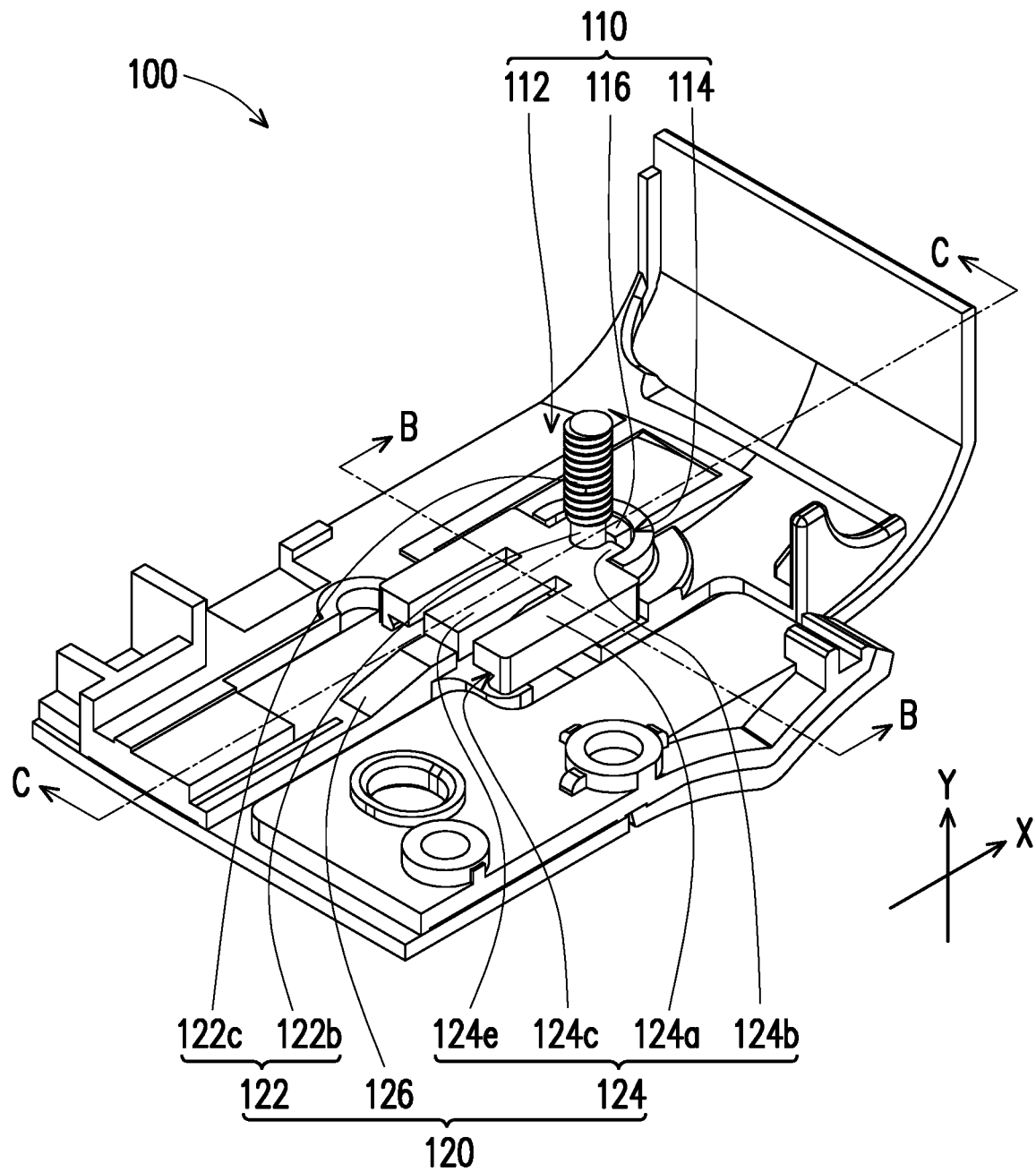
FIG. 5 is a schematic view of the assembly element fixed to the housing.
Figure 6:
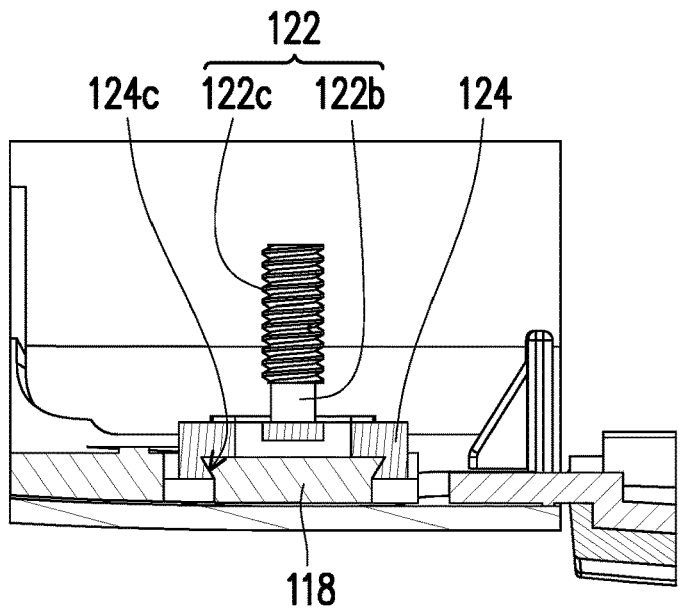
FIG. 6 is a schematic cross-sectional view along the line B-B of FIG. 5.
Figure 7:
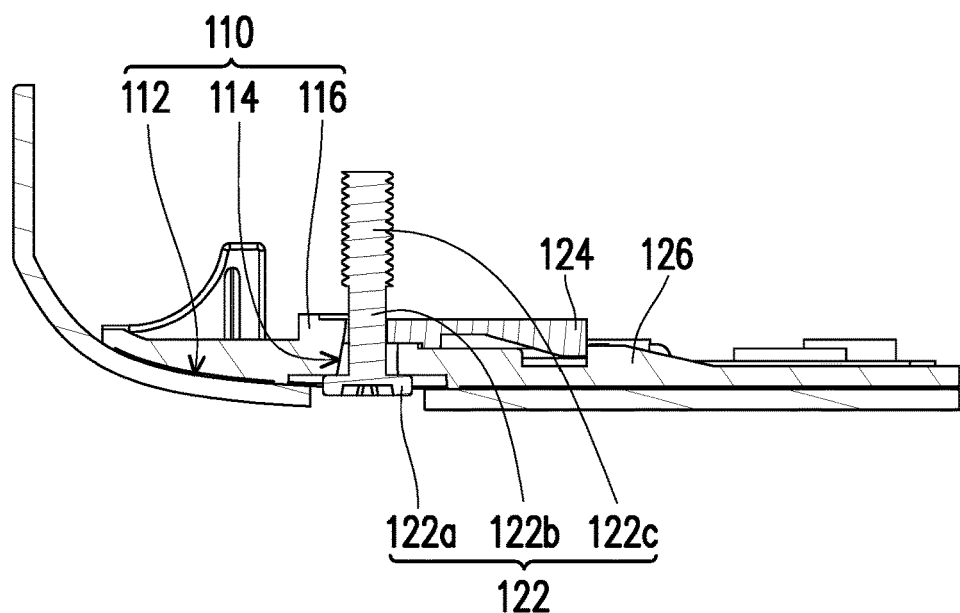
FIG. 7 is a schematic cross-sectional view along the line C-C of FIG. 5.

FIG. 5 is a schematic view of the assembly element 122 fixed to the housing 110, FIG. 6 is a schematic cross-sectional view along the line B-B of FIG. 5, and FIG. 7 is a schematic cross-sectional view along the line C-C of FIG. 5. Referring to FIG. 5, FIG. 6, and FIG. 7, in order to easily guide the slider 124 to move relative to the housing 110 to be fitted to the assembly element 122, the housing 110 further includes a first guiding structure 118, and the slider 124 further includes a second guiding structure 124c. The first guiding structure 118 and the second guiding structure 124c are fitted to each other for the slider 124 to move linearly relative to the housing 110. In this embodiment, the first guiding structure 118 is a position limiting rib, and the second guiding structure 124c is a position limiting groove, but the disclosure is not limited thereto. The first guiding structure 118 may be a position limiting groove and the second guiding structure 124c may be a position limiting rib. The first guiding structure 118 and the second guiding structure 124c may also have other structures with the same functions but different shapes, which can be changed by those skilled in the art according to the actual needs.

It can be seen from FIG. 6 that the first guiding structure 118 that is a position limiting rib is roughly T-shaped. The second guiding structure 124c that is a position limiting groove is located on two opposite sides of the body portion 124a, and the position limiting rib is correspondingly fitted into the position limiting groove. Therefore, the first guiding structure 118 allows the slider 124 to only move linearly along the second direction X, but not to move along the first direction Y, which prevents the slider 124 from falling off from the housing 110.

As the slider 124 moves close to the assembly element 122 along the second direction X, after the U-shaped portion 124b at the front end of the body portion 124a is fitted to the threadless area 122b of the assembly element 122, the abutting member 126 abuts against the rear end of the slider 124 so as to limit the position of the slider 124.

Furthermore, in this embodiment, the body portion 124a of the slider 124 has a trident shape. The position limiting groove (second guiding structure 124c) is provided on the two outer blades of the trident, and when the abutting member 126 abuts against the rear end of the slider 124, the abutting member 126 abuts against the blade 124e located in the middle. The middle blade 124e is an elastic arm. By moving the middle blade 124e, it is possible to release the slider 124 from the abutting member 126, which makes it easy to reassemble if there is an assembly error.

Figure 8A:
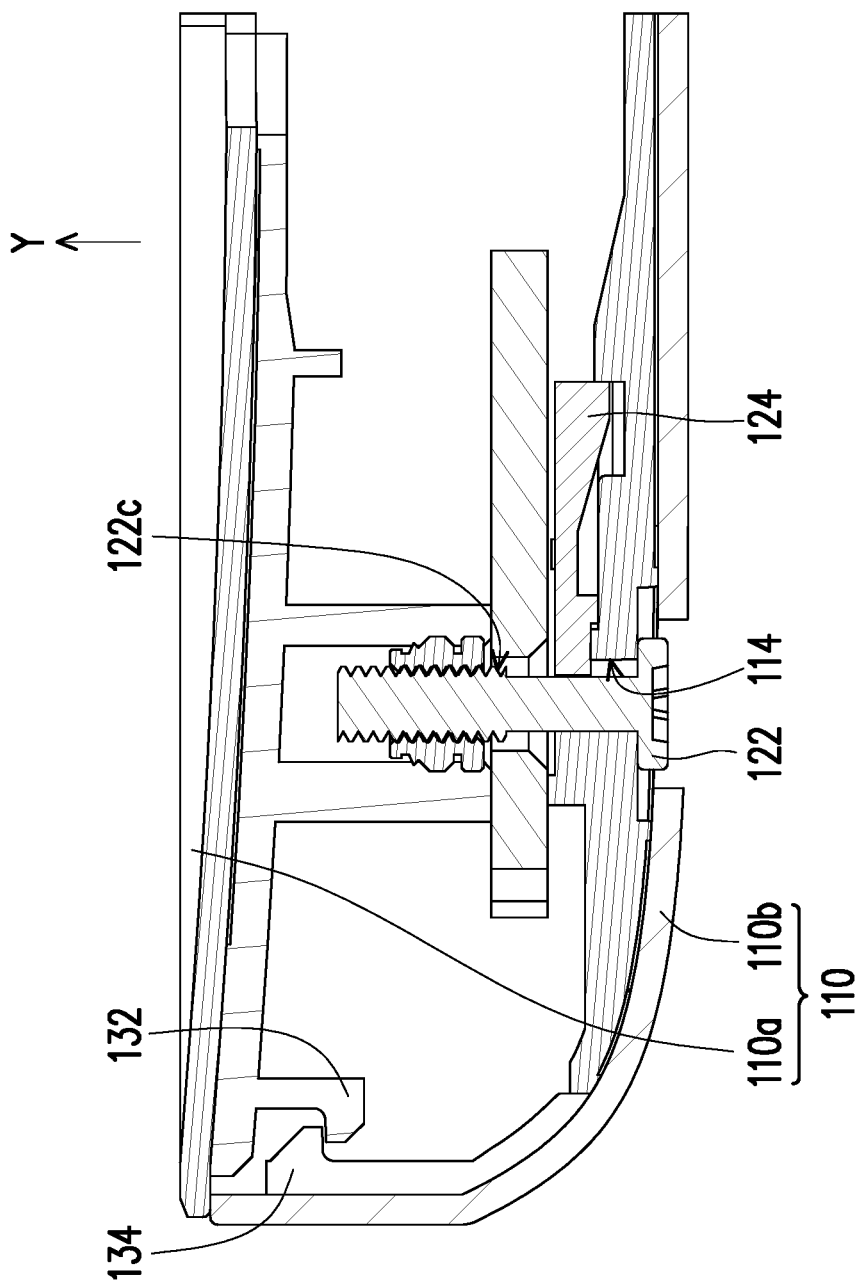
FIG. 8A to FIG. 8C are schematic views of unscrewing the assembly element.
Figure 8B:
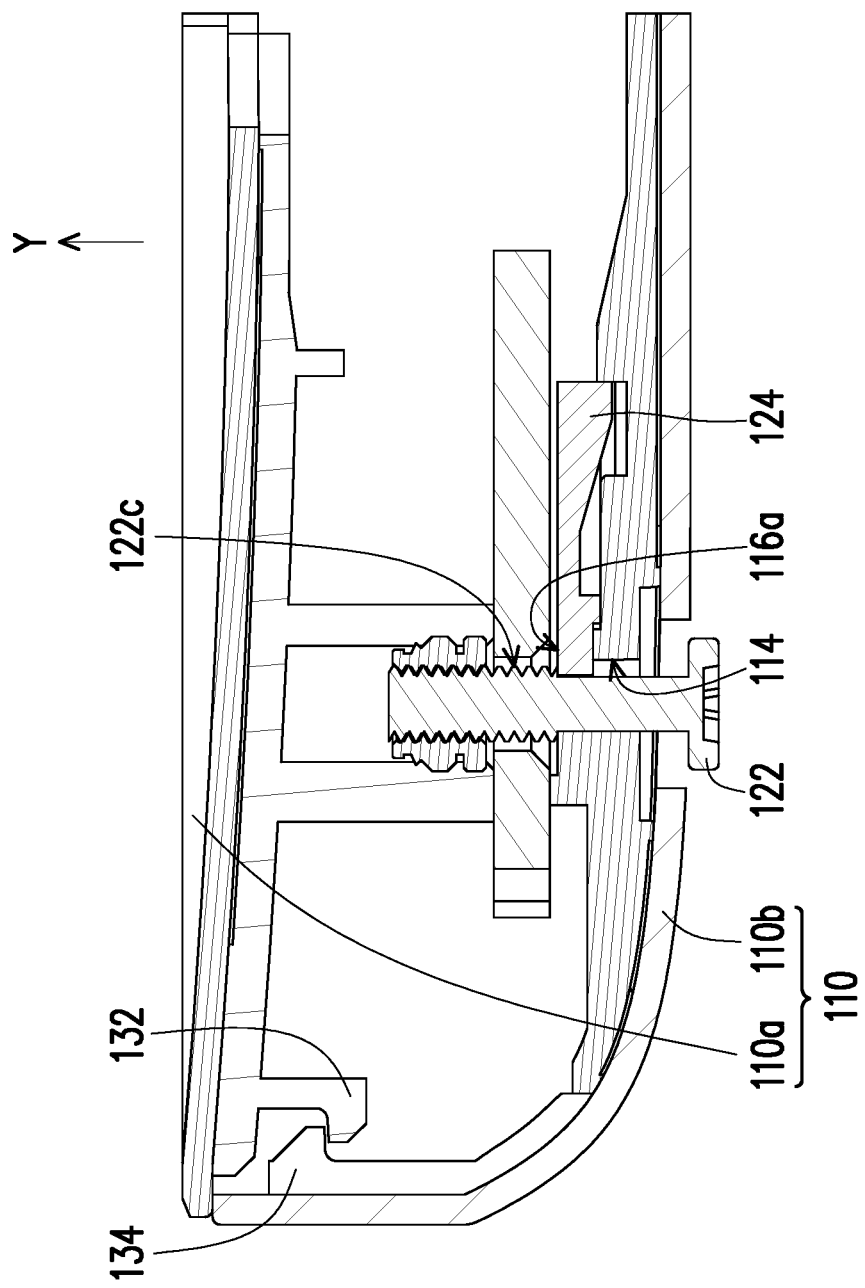
Figure 8C:
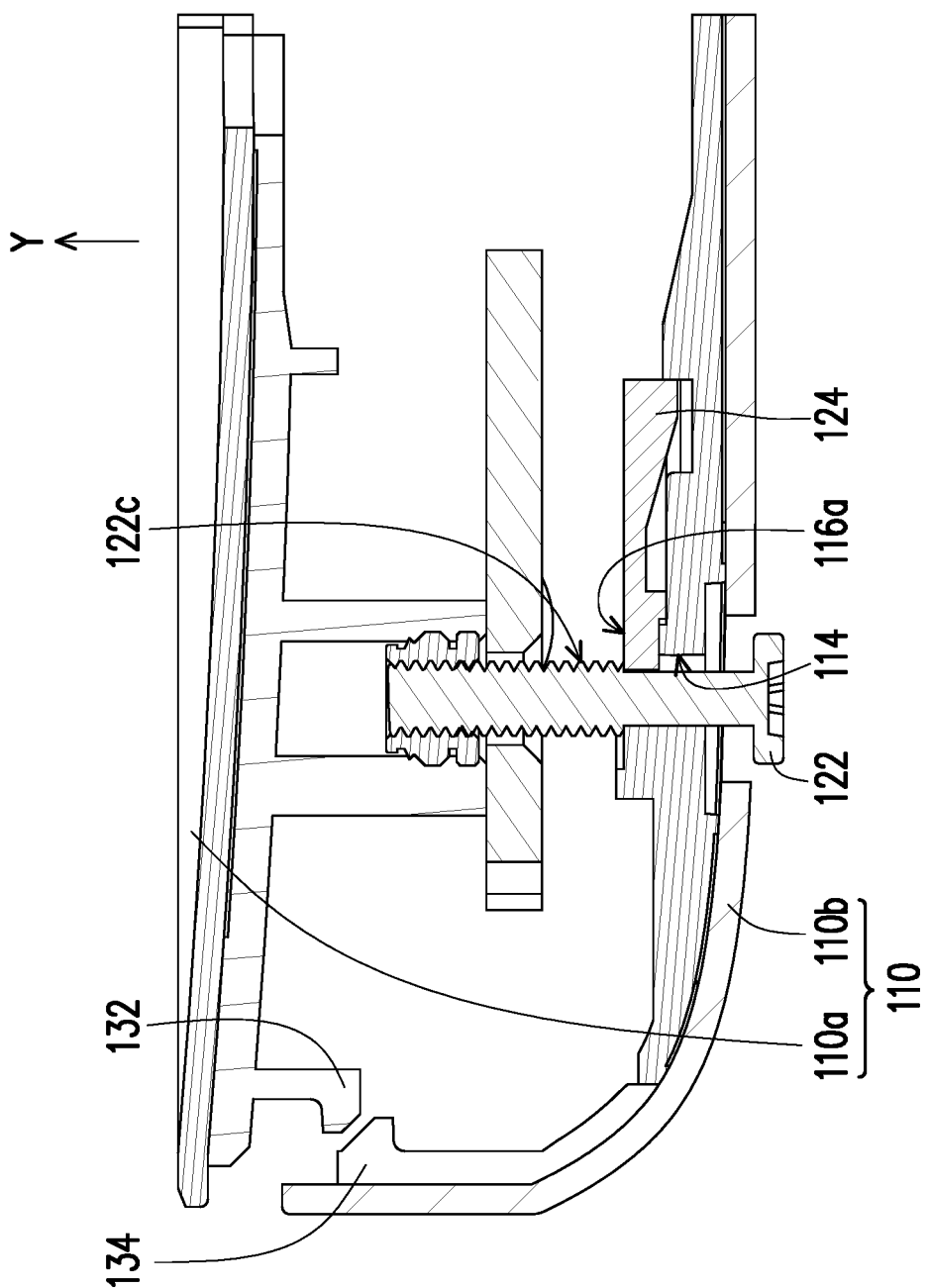

FIG. 8A to FIG. 8C are schematic views of unscrewing the assembly element. Referring to FIG. 8A to FIG. 8C, when unscrewing the assembly element 122, the user uses a hand tool (not shown), such as a screwdriver, to turn the assembly element 122 so as to retreat the assembly element 122 from the first hole 114 in the direction reverse to the first direction Y.

When the thread of the threaded area 122c of the assembly element 122 comes into contact with the stop surface 116a, the stop surface 116a restricts the assembly element 122 from being further retreated from the first hole 114 in the direction reverse to the first direction Y. However, as the user continues to apply a force to rotate the assembly element 122, the upper cover 110a and the lower cover 110b of the housing 110, which are fixed at relative positions by the hooks 132 and 134, are pushed away from each other due to the separation of the hooks 132 and 134.

After the lower cover 110b is pushed away from the upper cover 110a, the user can easily remove the lower cover 110b and replace the components in the housing 110.

In summary, in the buckle assembly according to the disclosure, the conventional E-ring is replaced by the slider, which prevents the slider used to fix the assembly element from falling into the electronic device to cause a short circuit and burn the circuit board after the assembly element is unscrewed. Therefore, the service life of the electronic device using the buckle assembly can be prolonged without affecting the replacement of internal components.

In addition, when the assembly element is unscrewed, the stop rib prevents the screw from falling off from the housing and being lost, and the lower cover is pushed away from the upper cover for the user to easily replace the components in the housing.

Although the disclosure has been described with reference to the above embodiments, they are not intended to limit the disclosure. It will be apparent to those skilled in the art that various modifications and variations can be made to the disclosure without departing from the scope or spirit of the disclosure. In view of the foregoing, it is intended that the disclosure covers modifications and variations provided they fall within the scope of the following claims and their equivalents.

What is claimed is:

1. A buckle assembly adapted to be assembled on a housing that has an inner surface and a first hole, the buckle assembly comprising:
an assembly element assembled in the first hole along a first direction;
a slider disposed on the inner surface of the housing and capable of moving relative to the housing along a second direction to lock or unlock the assembly element, wherein the second direction is perpendicular to the first direction; and
an abutting member disposed on the inner surface of the housing and adapted to abut against the slider when the slider locks the assembly element.

2. The buckle assembly according to claim 1, wherein the assembly element is a screw and the first hole is a screw hole.

3. The buckle assembly according to claim 2, wherein the screw comprises a screw head, a threadless area, and a threaded area, and the threadless area is located between the screw head and the threaded area.

4. The buckle assembly according to claim 1, wherein the slider comprises a body portion and a U-shaped portion, and the U-shaped portion is located at an end of the body portion relatively close to the assembly element.

5. The buckle assembly according to claim 1, wherein the housing further comprises a first guiding structure, and the slider further comprises a second guiding structure, and the first guiding structure and the second guiding structure are fitted to each other for the slider to move linearly relative to the housing.

6. The buckle assembly according to claim 5, wherein one of the first guiding structure and the second guiding structure is a position limiting rib, and the other of the first guiding structure and the second guiding structure is a position limiting groove.

7. An electronic device, comprising:
a housing having an inner surface and a first hole; and
a buckle assembly assembled on the housing and comprising:
an assembly element assembled in the first hole along a first direction;
a slider disposed on the inner surface of the housing and capable of moving relative to the housing along a second direction to lock or unlock the assembly element, wherein the second direction is perpendicular to the first direction; and
an abutting member disposed on the inner surface of the housing and adapted to abut against the slider when the slider locks the assembly element.

8. The electronic device according to claim 7, wherein the assembly element is a screw and the first hole is a screw hole.

9. The electronic device according to claim 8, wherein the screw comprises a screw head, a threadless area, and a threaded area, and the threadless area is located between the screw head and the threaded area.

10. The electronic device according to claim 9, wherein the housing further comprises a stop rib disposed on the inner surface and adjacent to the first hole, and when the screw is screwed into the housing and unlocked from the slider, a bottom end of the threaded area comes into contact with the stop rib.

11. The electronic device according to claim 10, wherein a surface of the stop rib facing an upper cover of the housing and a surface of the slider facing the upper cover of the housing jointly form a stop surface, and when the screw is unscrewed from the first hole, the stop surface supports and stops the screw from completely falling out of the first hole.

12. The electronic device according to claim 7, wherein the slider comprises a body portion and a U-shaped portion, and the U-shaped portion is located at an end of the body portion relatively close to the assembly element.

13. The electronic device according to claim 7, wherein the housing further comprises a first guiding structure, and the slider further comprises a second guiding structure, and the first guiding structure and the second guiding structure are fitted to each other for the slider to move linearly relative to the housing.

14. The electronic device according to claim 13, wherein one of the first guiding structure and the second guiding structure is a position limiting rib, and the other of the first guiding structure and the second guiding structure is a position limiting groove.

15. The electronic device according to claim 7, wherein a hole diameter of the first hole gradually decreases from an outer surface of the housing toward the inner surface.

* * * * *